(12) United States Patent
Kijima et al.

(10) Patent No.: US 7,214,977 B2
(45) Date of Patent: May 8, 2007

(54) FERROELECTRIC THIN FILM, METHOD OF MANUFACTURING THE SAME, FERROELECTRIC MEMORY DEVICE AND FERROELECTRIC PIEZOELECTRIC DEVICE

(75) Inventors: Takeshi Kijima, Matsumoto (JP); Yasuaki Hamada, Suwa (JP); Eiji Natori, Chino (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 11/241,959

(22) Filed: Oct. 4, 2005

(65) Prior Publication Data
US 2006/0027849 A1 Feb. 9, 2006

Related U.S. Application Data

(62) Division of application No. 10/743,716, filed on Dec. 24, 2003.

(30) Foreign Application Priority Data
Dec. 27, 2002 (JP) .............................. 2002-379418

(51) Int. Cl.
H01L 29/76 (2006.01)
H01L 29/94 (2006.01)
H01L 31/00 (2006.01)

(52) U.S. Cl. ............... 257/295; 257/296; 257/E21.663; 257/E27.104; 257/E29.164

(58) Field of Classification Search ................ 257/296, 257/295, E21.272
See application file for complete search history.

(56) References Cited

U.S. PATENT DOCUMENTS

| | | | | | |
|---|---|---|---|---|---|
| 5,426,075 | A | * | 6/1995 | Perino et al. | 438/3 |
| 6,093,338 | A | * | 7/2000 | Tani et al. | 252/62.9 R |
| 6,396,094 | B1 | * | 5/2002 | Mirkarimi et al. | 257/295 |
| 6,440,591 | B1 | * | 8/2002 | Matsunaga et al. | 428/699 |
| 6,737,690 | B2 | | 5/2004 | Higuchi et al. | 257/295 |
| 6,974,985 | B2 | * | 12/2005 | Kurasawa et al. | 257/296 |
| 7,033,001 | B2 | * | 4/2006 | Fujii et al. | 347/68 |
| 2001/0013311 | A1 | * | 8/2001 | Migita et al. | 117/1 |
| 2002/0102791 | A1 | | 8/2002 | Kurasawa et al. | 438/240 |
| 2002/0155667 | A1 | | 10/2002 | Higuchi et al. | |
| 2003/0227803 | A1 | * | 12/2003 | Natori et al. | 365/200 |

* cited by examiner

Primary Examiner—David Zarneke
Assistant Examiner—Igwe U. Anya
(74) Attorney, Agent, or Firm—Oliff & Berridge, PLC

(57) ABSTRACT

A ferroelectric thin film formed of a highly oriented polycrystal in which 180° domains and 90° domains arrange at a constant angle to an applied electric field direction in a thin film plane and reversely rotate in a predetermined electric field.

8 Claims, 13 Drawing Sheets (111)

FERROELECTRIC THIN FILM, METHOD OF MANUFACTURING THE SAME, FERROELECTRIC MEMORY DEVICE AND FERROELECTRIC PIEZOELECTRIC DEVICE

This is a Divisional of application Ser. No. 10/743,716 filed Dec. 24, 2003. The entire disclosure of the prior application is hereby incorporated by reference herein in its entirety.

Japanese Patent Application No. 2002-379418, filed on Dec. 27, 2002, is hereby incorporated by reference in its entirety.

BACKGROUND OF THE INVENTION

In recent years, research and development of a thin film such as PZT or SBT, and a ferroelectric capacitor and a ferroelectric memory device using such a thin film have been extensively conducted. The structure of the ferroelectric memory device is roughly divided into 1T, 1T1C, 2T2C, and simple matrix. Since the 1T ferroelectric memory device has retention time (data retention time) as short as one month due to occurrence of an internal electric field in the capacitor because of its structure, it is considered to be impossible to secure a 10-year guarantee generally required for semiconductors. The 1T1C and 2T2C ferroelectric memory devices have almost the same configuration as that of a DRAM, and include a select transistor. Therefore, the DRAM manufacturing technology can be utilized. Moreover, since the 1T1C and 2T2C ferroelectric memory devices realize a write speed equal to that of an SRAM, small capacity products with a capacity of 256 kbits or less have been produced on a commercial basis.

As the ferroelectric material, $Pb(Zr,Ti)O_3$ (PZT) has been mainly used. PZT having a composition in or near a mixed region of a rhombohedral crystal and a tetragonal crystal, in which the Zr/Ti ratio is 52/48 or 40/60, is used after doping with an element such as La, Sr, or Ca. The reason why this region is used after doping is to secure reliability indispensable for a memory device.

PZT, which has been widely applied to a ferroelectric memory, is a solid solution of $PbZrO_3$ and $PbTiO_3$. In the case where PZT contains Zr at a ratio greater than Zr:Ti=52/48, PZT shows a narrow hysteresis shape. In the case where PZT contains a greater amount of Ti, PZT shows a hysteresis shape with excellent squareness.

The hysteresis shape immediately after writing data is better in the Ti-rich tetragonal region. The Ti-rich tetragonal region is suitable for memory applications if only the hysteresis shape is taken into consideration. However, PZT in the tetragonal region has not been put into commercial use as a ferroelectric memory device since reliability cannot be secured.

Among a number of reliability tests, a reliability test called a static imprint test is the most rigorous test. In this test, a ferroelectric memory in which data "1" or "0" is written, that is, a ferroelectric thin film polarized at "+" or "−" is allowed to stand at a predetermined temperature (85° C. or 150° C., for example) for a predetermined time (100 or 1000 hours, for example), and whether or not the originally written data can be read is tested.

As described above, the hysteresis shape immediately after writing data is better in the Ti-rich tetragonal region. However, the Ti-rich tetragonal region means that most of the crystal constituent elements consist of Pb and Ti.

Pb has a high vapor pressure, and produces PbO vapor at a low temperature of about 100° C. as known from the Ellingham diagram. Moreover, Pb has the smallest bond energy with oxygen (38.8 kcal/mol), and tends to cause Pb deficiency to occur in the PZT crystal. Ti has a bond energy with oxygen of 73 kcal/mol, which is about twice the Pb—O bond energy. However, since Ti has the smallest atomic weight (47.88) among the constituent elements of PZT, which is about half the atomic weight of Zr (91.224) which is also a B site constituent element, it is most likely that Ti is scattered during oscillating bombardment which occurs during the heat treatment in the static imprint test, whereby Ti deficiency tends to occur in the PZT crystal. These defects result in space charge polarization, and cause imprint characteristics to deteriorate.

Moreover, O deficiency occurs from the charge neutrality principle, whereby Schottky defects occur due to the ionic crystal structure. This causes leakage current characteristics to deteriorate, whereby reliability cannot be secured.

A reduction of the device size and the thickness of the ferroelectric thin film has progressed accompanying an increase in the degree of integration of the ferroelectric memory and the necessity of low voltage drive. Therefore, in the case of using PZT as the ferroelectric material, it is impossible to utilize the Zr-rich composition used for a small capacity memory. This makes it necessary to use PZT having a Ti-rich composition.

Specifically, since the relative dielectric constant is increased due to a reduction of the film thickness, the hysteresis shape becomes narrower. Zr-rich PZT has not posed problems relating to reliability such as imprint characteristics in practical application. However, if the hysteresis shape becomes further narrowed, deterioration of imprint characteristics will come to the surface. Therefore, in order to make the hysteresis shape closer to the hysteresis shape used for a small capacity memory by decreasing the relative dielectric constant, PZT having a Ti-rich composition must be used. This causes the above-described problems to occur. Therefore, it is impossible to increase the integration of the ferroelectric memory unless the problems of Ti-rich PZT are solved.

The simple matrix ferroelectric memory device has a cell size smaller than that of the 1T1C and 2T2C ferroelectric memory devices, and enables multilayering of the capacitors. Therefore, an increase in the degree of integration and a reduction of cost are expected. A conventional simple matrix ferroelectric memory device is disclosed in Japanese Patent Application Laid-open No. 9-116107, for example. Japanese Patent Application Laid-open No. 9-116107 discloses a drive method in which a voltage of one-third a write voltage is applied to unselected memory cells when writing data into the memory cell. However, this technology does not describe the hysteresis loop of the ferroelectric capacitor necessary for the operation in detail. The present inventors have advanced development and found that a hysteresis loop with excellent squareness is indispensable to obtain a simple matrix ferroelectric memory device which can be operated in practice. As a ferroelectric material which can deal with such a requirement, Ti-rich tetragonal PZT may be considered as a candidate. However, the most important subject is to secure reliability in the same manner as the 1T1C and 2T2C ferroelectric memories.

A ferroelectric thin film used for a ferroelectric memory is generally used in a state in which the polarization axis of the ferroelectric is aligned in the direction of an applied electric field.

In PZT, the Zr/Ti ratio of 52/48 is called a phase boundary, which is a mixed region of a rhombohedral crystal and a tetragonal crystal. If Zr exceeds 52, the crystal structure becomes rhombohedral. If Ti exceeds 48, the crystal structure becomes tetragonal.

In rhombohedral PZT, the polarization axis exists along the <001> axis. In tetragonal PZT, the polarization axis exists along the <111> axis. Therefore, in the case of using a PZT thin film for a ferroelectric memory, the PZT thin film is generally used in a state in which the orientation is aligned with the polarization axis direction, as described in 49*th Japan Society of Applied Physics and Related Societies Meeting Preliminary Report* 27a-ZA-6.

However, domains which are sources of ferroelectricity are present in the ferroelectric in addition to the crystal orientation. The domains include a 180° domain and a 90° domain.

In the case where the polarization axis is aligned with the crystal orientation axis, the 180° domain parallel to the applied electric field contributes to polarization, but the 90° domain does not contribute to polarization.

If an ideal ferroelectric capacitor is formed, since the 90° domain does not contribute to polarization, a serious problem does not occur even if the 90° domain exists. However, the contribution rate of the entire PZT thin film to polarization is reduced by an amount for the existence of the 90° domain.

In the actual ferroelectric capacitor, the uppermost surface of the electrode is not completely flat and has unevenness, and a crystal is grown in an inclined state in most cases. In this case, the 90° domain does not become completely perpendicular to the applied electric field, and is at an angle to the applied electric field to some extent. In this case, the 90° domain contributes to polarization. However, since the polarization axis exists in the direction approximately at right angles to the applied electric field, a considerably large electric field is necessary to cause the 90° domain to contribute as the polarization in comparison with the 180° domain. Specifically, it becomes difficult to use the ferroelectric capacitor at a low voltage.

BRIEF SUMMARY OF THE INVENTION

The present invention may provide a ferroelectric thin film which is applied to a ferroelectric capacitor and has hysteresis characteristics which can be used for 1T1C, 2T2C, and simple matrix ferroelectric memories.

The present invention relates to a ferroelectric thin film formed of crystals in which directions of polarization axes are inconsistent with an applied electric field direction in a crystal system.

DETAILED DESCRIPTION OF THE EMBODIMENT

A ferroelectric memory device according to the present embodiment is a ferroelectric memory device which includes a first electrode electrically connected with a source or drain electrode of a CMOS transistor formed on an Si wafer in advance, a ferroelectric film formed on the first electrode, and a second electrode formed on the ferroelectric film, wherein a select operation of a capacitor formed by the first electrode, the ferroelectric film, and the second electrode is performed by the CMOS transistor formed on the Si wafer in advance, and a ferroelectric memory device which includes third electrodes formed in advance, fourth electrodes arranged in a direction which intersects the third electrodes, and ferroelectric films disposed at least in intersecting regions of the third electrodes and the fourth electrodes, wherein capacitors formed by the third electrodes, the ferroelectric films, and the fourth electrodes are disposed in a matrix, wherein the ferroelectric film is a polycrystalline thin film, in which polarization axes differ from an axis of an applied electric field, the polarization axes are at an arbitrary single angle in a plane perpendicular to the electric field, and all the polarization axes are nonpolar to the applied electric field.

A method of manufacturing a ferroelectric memory according to the present embodiment includes a step of applying a sol-gel solution for forming a ferroelectric thin film which is a first material solution and crystallizing the sol-gel solution, wherein the first material solution is a material solution for forming a ferroelectric layer, is a material solution indispensable for forming the resulting thin film as a ferroelectric layer, and may include a substance other than a target ferroelectric thin film composition in a crystallization stage. This includes the case where a catalytic oxide which promotes low temperature crystallization is formed in a thin film formation stage, and is finally included in the thin film as the thin film constituent element, for example.

The present embodiment may be applied not only to a ferroelectric memory, but also to devices utilizing ferroelectricity such as a piezoelectric device and a pyroelectric element.

The ferroelectric memory according to the embodiment of the present invention is formed as described below.

Figure 1:
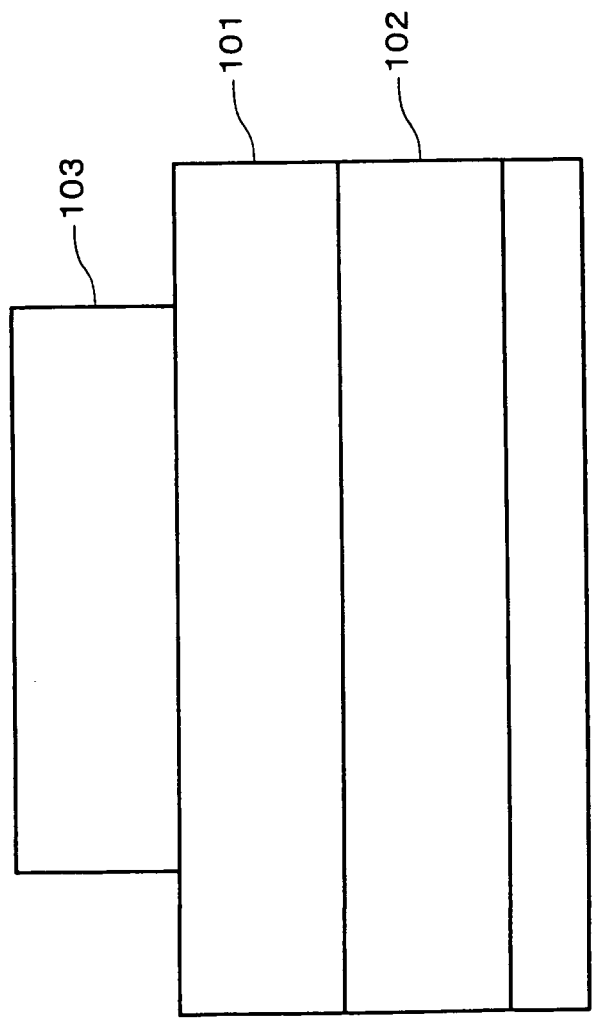
FIG. 1 is a diagram showing configuration of a ferroelectric capacitor according to one embodiment of the present invention.

FIG. 1 is a view showing a ferroelectric capacitor in a ferroelectric memory device in the present embodiment. In FIG. 1, 101 denotes a PZTN ferroelectric film according to the present invention, 102 denotes a first electrode, and 103 denotes a second electrode. The ferroelectric film may include silicon, or silicon and germanium, in elements of ferroelectric. The first electrode 102 and the second electrode 103 are formed of a noble metal element such as Pt, Ir, or Ru, or a composite material containing the noble metal as a major component. If the element of the ferroelectric is diffused into the first electrode, squareness of hysteresis is decreased due to composition variation at the interface between the electrode and the ferroelectric film. Therefore, the first electrode must have a density which does not allow the element of the ferroelectric to diffuse into the first electrode. In order to increase the density of the first electrode, a method of depositing the first electrode by sputtering using a heavy gas, or a method of dispersing an oxide of Y, La, or the like into the noble metal electrode is used, for example. In FIG. 1, the substrate and other constituent elements (MOS transistors and the like) of the ferroelectric memory device are omitted. These constituent elements are described later.

An example of the ferroelectric thin film 101 which is a polycrystalline thin film according to the present embodiment, in which the polarization axes differ from the axis of the applied electric field, the polarization axes are at an arbitrary single angle in a thin film plane perpendicular to the electric field, and all the polarization axes are nonpolar to the applied electric field, is described below.

A first material solution is a solution in which a polycondensation product for forming a $PbZrO_3$ perovskite crystal formed by Pb and Zr among constituent metal elements of a PZTN ferroelectric phase is dissolved in a solvent such as n-butanol in an anhydrous state.

A second material solution is a solution in which a polycondensation product for forming a $PbTiO_3$ perovskite crystal formed by Pb and Ti among constituent metal elements of a PZTN ferroelectric phase is dissolved in a solvent such as n-butanol in an anhydrous state.

In the case of forming a $PbZr_{0.2}Ti_{0.8}O_3$ ferroelectric using the first and second material solutions, the first and second material solutions are mixed at a ratio of (first material solution):(second material solution)=2:8. The mixed solution was crystallized on a highly (111)-oriented polycrystalline Pt electrode to obtain a PZT thin film, (111)-oriented in the direction of the applied electric field (direction perpendicular to the polycrystalline Pt electrode plane), in which the 180° domain among the polarization is arranged in the polycrystalline Pt electrode plane at an angle of 35.9255° to the polycrystalline Pt electrode plane, and the 90° domain among the polarization is arranged in the polycrystalline Pt electrode plane at an angle of 35.9253° to the polycrystalline Pt electrode plane, and which is spatially nonpolar to the applied electric field. This enables the 90° domain to be effectively utilized as the polarization together with the 180° domain.

Figure 2:
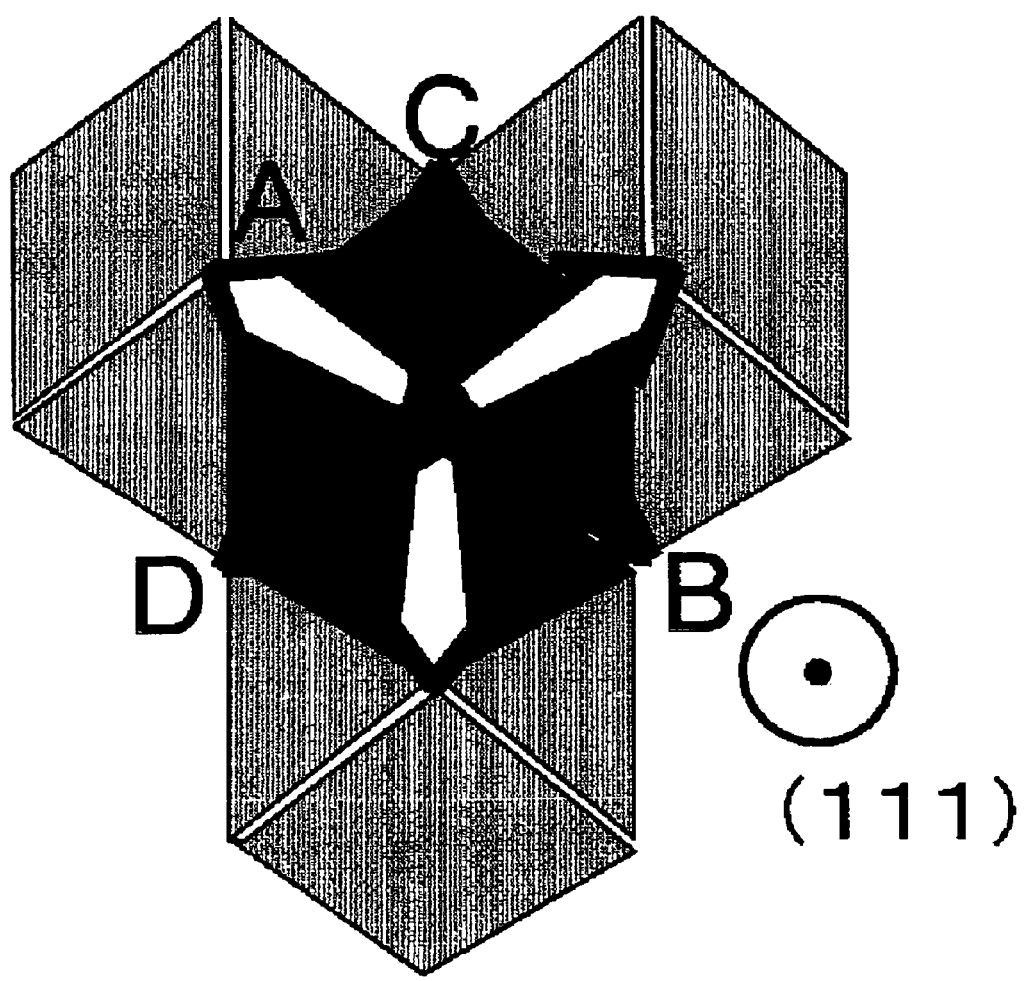
FIG. 2 is a diagram showing the relationship of polarization axes in a PZT crystal according to one embodiment of the present invention.

This is described below using a (111)-oriented $PbZr_{0.2}Ti_{0.8}O_3$ crystal shown in FIG. 2. The polarization axes of tetragonal PZT are (100), (010), (001), (−100), (0−10), and (00−1). FIG. 2 shows the polarization axes from the (111) direction. For example, if A is a polarization consisting of the 180° domain, A becomes B when the polarization is reversed. If A is a polarization consisting of the 90° domain, A becomes C or D when the polarization is reversed. Since B and C have almost equal energy, the polarization can be reversed at approximately the same applied electric field (the actual applied electric field differs for the difference 0.0002° between the angles 35.9255° and 35.9253° to the Pt electrode plane).

The above example is described using one $PbZr_{0.2}Ti_{0.8}O_3$ crystal for convenience of illustration. However, the present invention is not effective with a single crystal structure. This is because a large degree of anisotropy exists with respect to the applied electric field since only several polarization axes exist in a single crystal as shown in FIG. 2.

Since the thin film in the embodiment of the present invention is formed of a polycrystal and is arranged in the Pt electrode plane, the thin film is stable in energy with respect to the applied electric field and does not show anisotropy. Specifically, the polarization s can be reversed at the same time by the same applied electric field.

FIG. 2 shows the (111)-oriented tetragonal PZT single crystal. However, a polycrystalline film is employed in the embodiment of the present invention, and crystals are regularly aligned only in the (111) direction. Since the polarization axes are arranged in the plane, the polarization axes exist infinitely in the actual film. For example, the arranged polarization axes are represented by six vectors in FIG. 3 as described later.

In the case of a conventional PZT thin film used for ferroelectric memory applications, since the polarization axis is in the (001) direction in the above $PbZr_{0.2}Ti_{0.8}O_3$ thin film, a highly (001)-oriented thin film in the direction of the applied electric field is usually formed. For example, a (001)-oriented Pt electrode is formed on a (001)-oriented MgO single crystal substrate, and a (001)-oriented $PbZr_{0.2}Ti_{0.8}O_3$ thin film is epitaxially formed on the (001)-oriented Pt electrode. Since $PbZr_{0.2}Ti_{0.8}O_3$ has polarization axes in the (001) direction, the polarization axes are usually aligned in the direction of the applied electric field.

However, the 180° domain and the 90° domain exist in $PbZr_{0.2}Ti_{0.8}O_3$, and the polarization axis usually means the 180° domain. Since the 90° domain is a domain which exists perpendicularly to the 180° domain, the 90° domain exists in the (001)-oriented $PbZr_{0.2}Ti_{0.8}O_3$ thin film perpendicularly to the applied electric field and does not function as the polarization.

On the other hand, it is impossible to cause the entire polarization axes to be oriented in the (001) direction due to occurrence of internal stress in the film or the like. In this case, if the 90° domain exists even at 1%, since the 90° domain becomes a component which is polarized to only a small extent by the applied electric field as described in the section on the background art and the problems to be solved by the invention, a high voltage is necessary to cause the 90° domain which accounts for 1% to be reversed. This significantly hinders an increase in the integration and a decrease in drive voltage.

An orientation direction suitable for a ferroelectric polycrystalline thin film generally used for memory applications is described below in detail.

EXAMPLE 1

Figure 3:
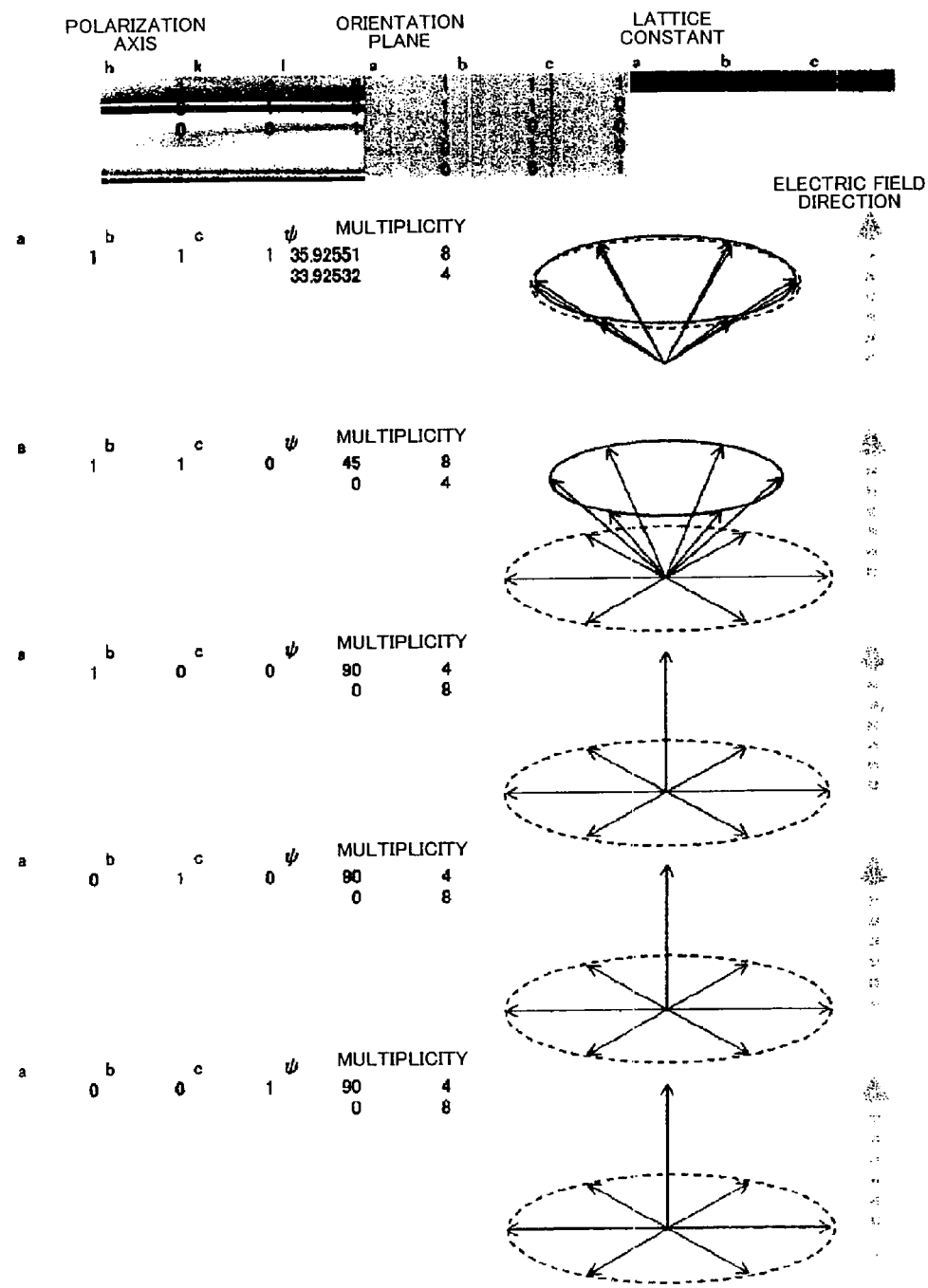
FIG. 3 is a diagram showing an orientation plane of PZT having a tetragonal structure suitable for device application, according to one embodiment of the present invention.

FIG. 3 shows an orientation plane suitable for device applications determined for PZT having a tetragonal structure. In FIG. 3, bulk values are used as the lattice constant, polarization axis direction (90° domain necessarily exists with the 180° domain), and polarization. The state in which the polarization axes infinitely exist in a rotated state in the film plane is shown by using six directions for convenience of illustration. As candidates for the orientation planes, orientation planes with high existence probability selected from JCPDS were used. In FIG. 3, the multiplicity means the degree in which the polarization axes completely overlap when determining the orientation plane suitable for device applications using the above parameters. In the case where two or more polarization axes remain, the higher the multiplicity, the higher the existence probability. The polarization axis with higher multiplicity effectively contributes to polarization with higher probability.

As a result, as described in the present embodiment, the effective 90° domain with respect to the actual applied electric field (component perpendicular to the electric field direction) exists in all the orientation planes other than the (111) orientation plane. Specifically, in the case of using PZT having a tetragonal structure, only the (111) orientation plane is suitable for causing polarization reversal at a low voltage or effectively utilizing all the polarization.

Figure 4:
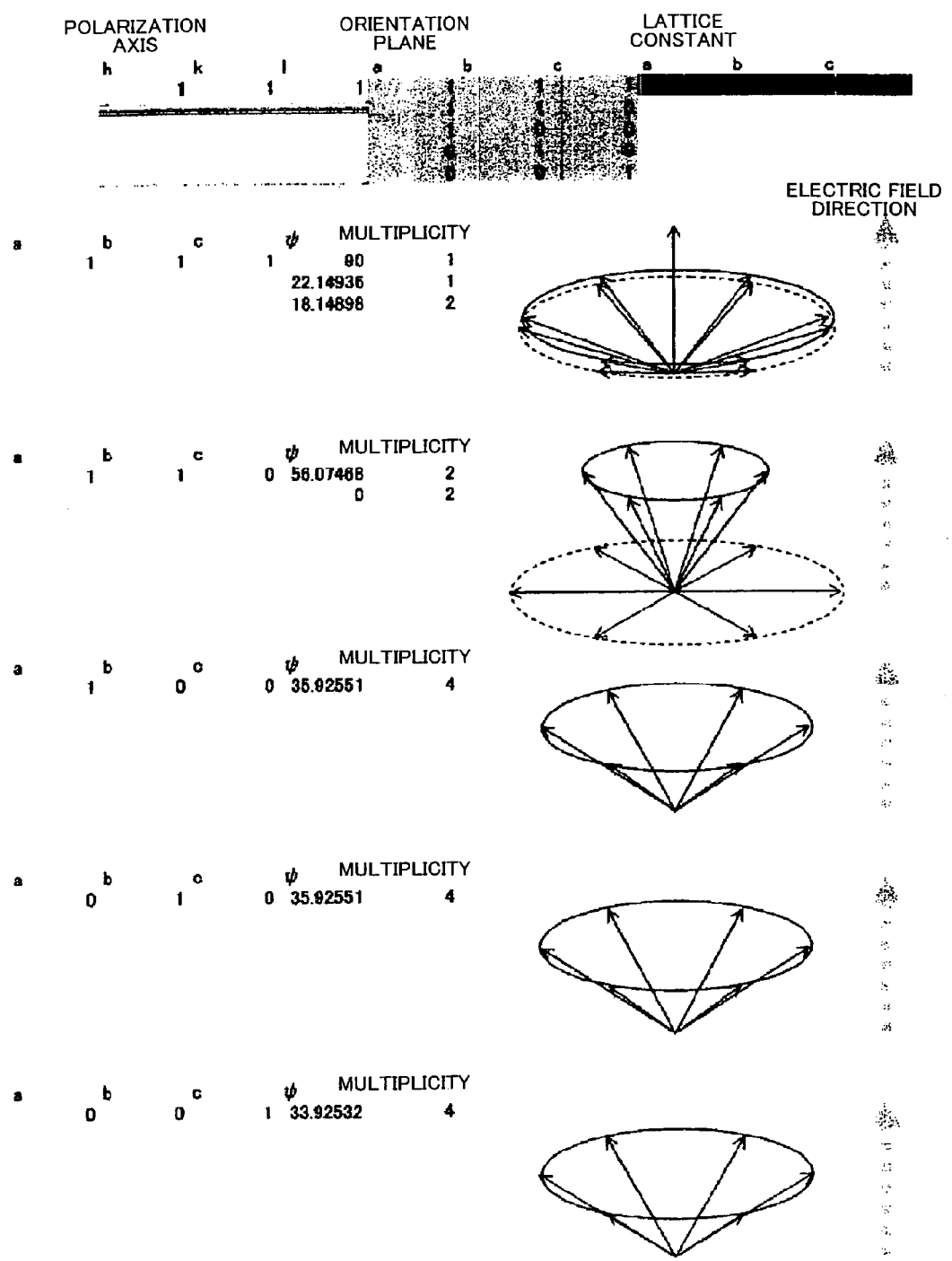
FIG. 4 is a diagram showing an orientation plane of PZT having a rhombohedral structure suitable for device application, according to one embodiment of the present invention.

FIG. 4 shows an orientation plane suitable for device applications determined for PZT having a rhombohedral structure. As shown in FIG. 4, the effective 90° domain exists only in (110) in PZT having a rhombohedral structure. Therefore, (111), (100), (101), and (001) are suitable for device applications. However, in the case where low voltage drive or squareness of hysteresis is required, the angle formed by the polarization axis and the direction of the electric field is preferably as small as possible, and the angle formed by the polarization axes is preferably small in the case where two or more polarization axes exist. Therefore, it is necessary to select (100), (101), or (001)-oriented PZT having a rhombohedral structure.

Figure 5:
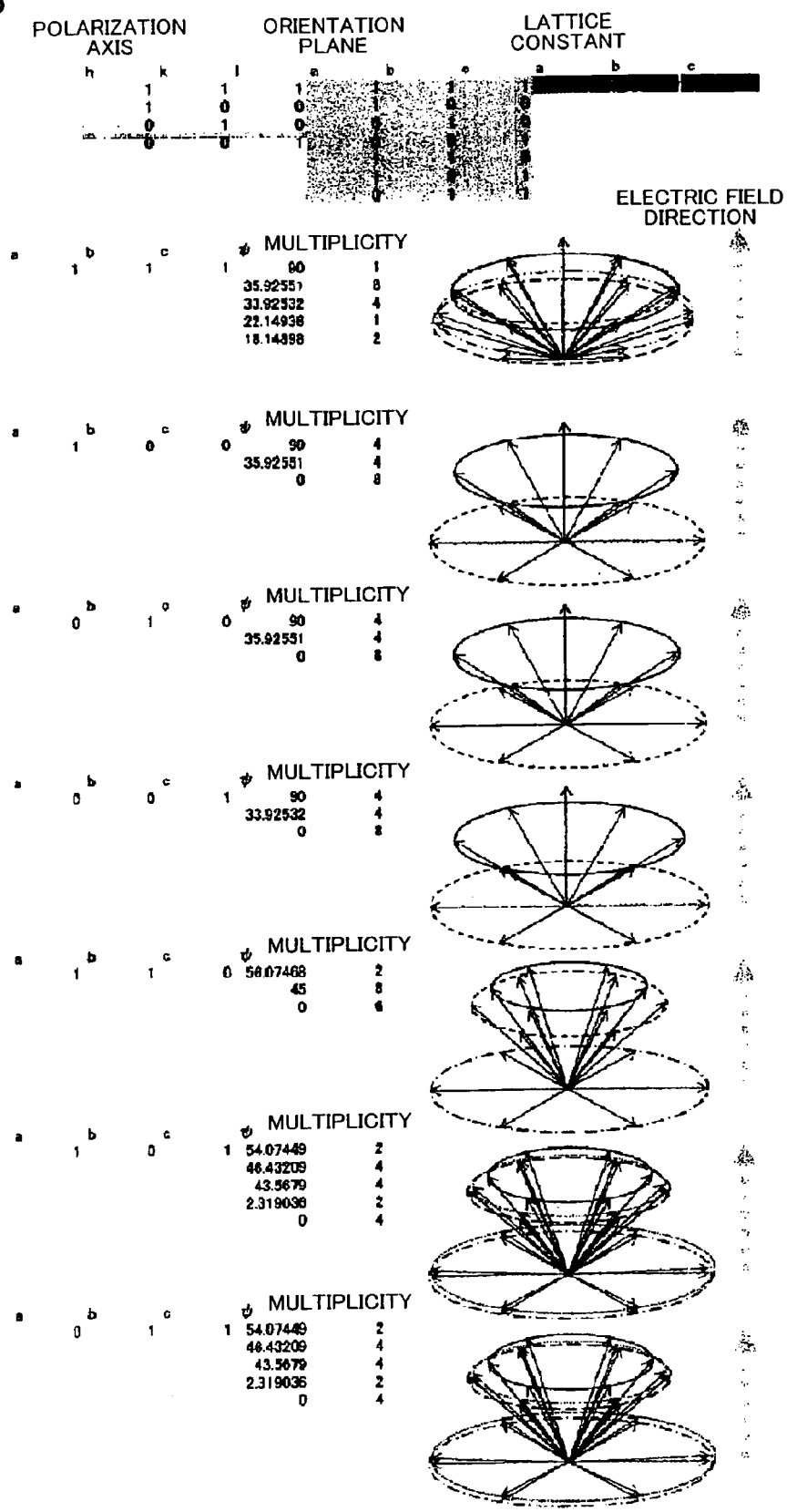
FIG. 5 is a diagram showing an orientation plane of PZT having an MPB structure suitable for device application, according to one embodiment of the present invention.

PZT with a Zr/Ti ratio of 52/48 is called an MPB region, and tetragonal PZT and rhombohedral PZT are present near this region in a mixed state. FIG. 5 shows an orientation plane suitable for device applications determined for the case of using the MPB region. In this case, the 90° domain effectively exists in most orientation planes. The 90° domain does not exist in only the (111) orientation plane. Since several polarization axes exist even if the 90° domain does not exist, it is difficult to obtain hysteresis with excellent squareness.

Figure 6:
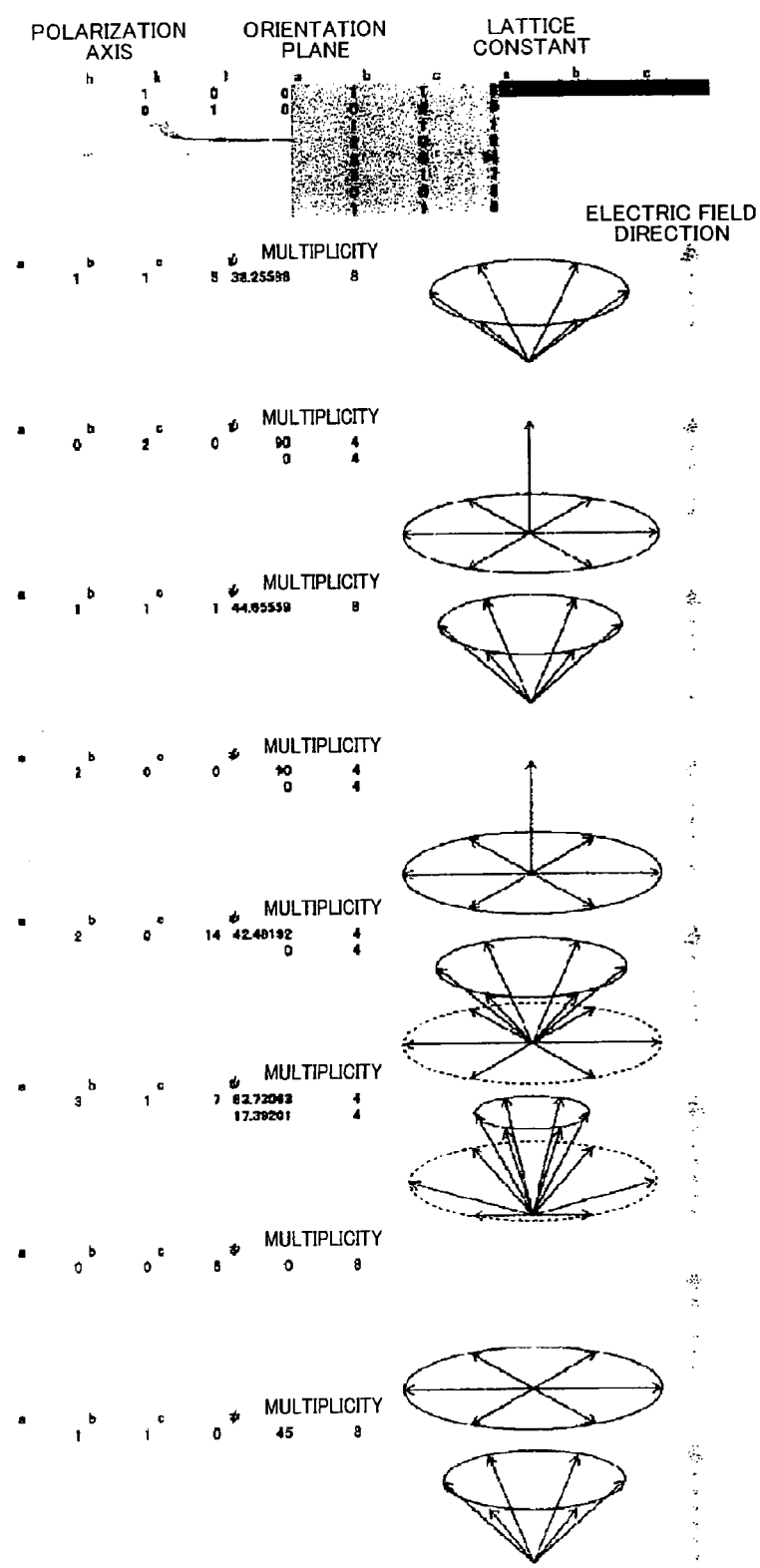
FIG. 6 is a diagram showing an orientation plane of a bismuth(Bi)-layer-structured $SrBi_2Ta_2O_9$ suitable for device application, according to one embodiment of the present invention.

FIG. 6 shows an orientation plane suitable for device applications determined for a bismuth(Bi)-layer-structured ferroelectric $SrBi_2Ta_2O_9$ (SBT). In the case of SBT, it is effective to use a (115), (111), or (110) orientation plane in which the 90° domain does not effectively exist.

Figure 7:
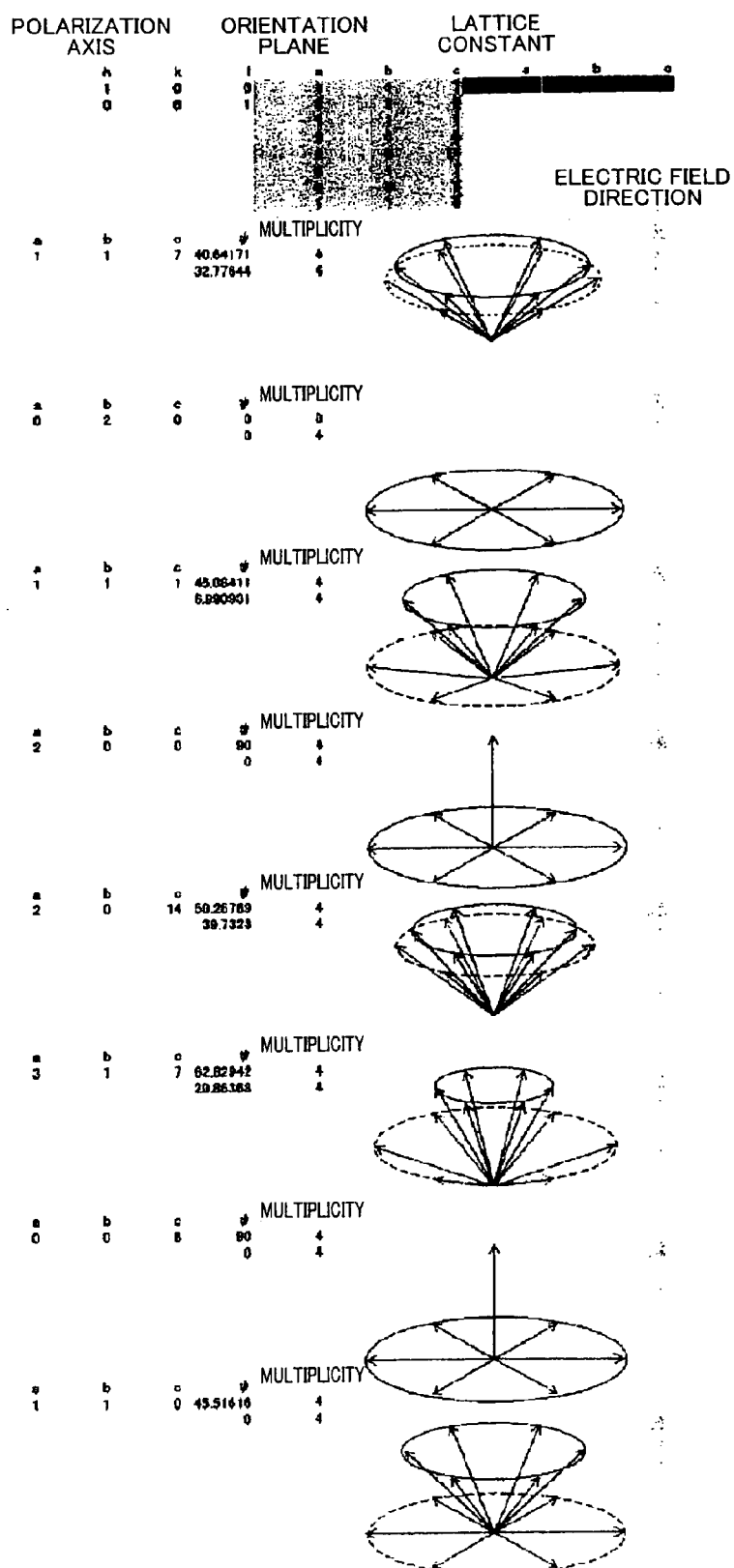
FIG. 7 is a diagram showing an orientation plane of a Bi-layer-structured $Bi_4Ti_3O_{12}$ suitable for device application, according to one embodiment of the present invention.

FIG. 7 shows an orientation plane suitable for device applications determined for a Bi-layer-structured ferroelectric $Bi_4Ti_3O_{12}$ (BIT). In the case of BIT, it is effective to use a (117), (107), or (317) orientation plane in which the 90° domain does not effectively exist.

A detailed example in which a ferroelectric thin film having the above-described orientation plane is described below.

EXAMPLE 2

In this example, a $PbZr_{0.4}Ti_{0.6}O_3$ ferroelectric thin film was formed.

A conventional method uses a solution containing Pb in an excess amount of about 20%. This aims at preventing volatilization of Pb and reducing the crystallization temperature. However, since the state of the excess Pb in the resulting thin film is unknown, the amount of excess Pb should be limited to the minimum.

Figure 8:
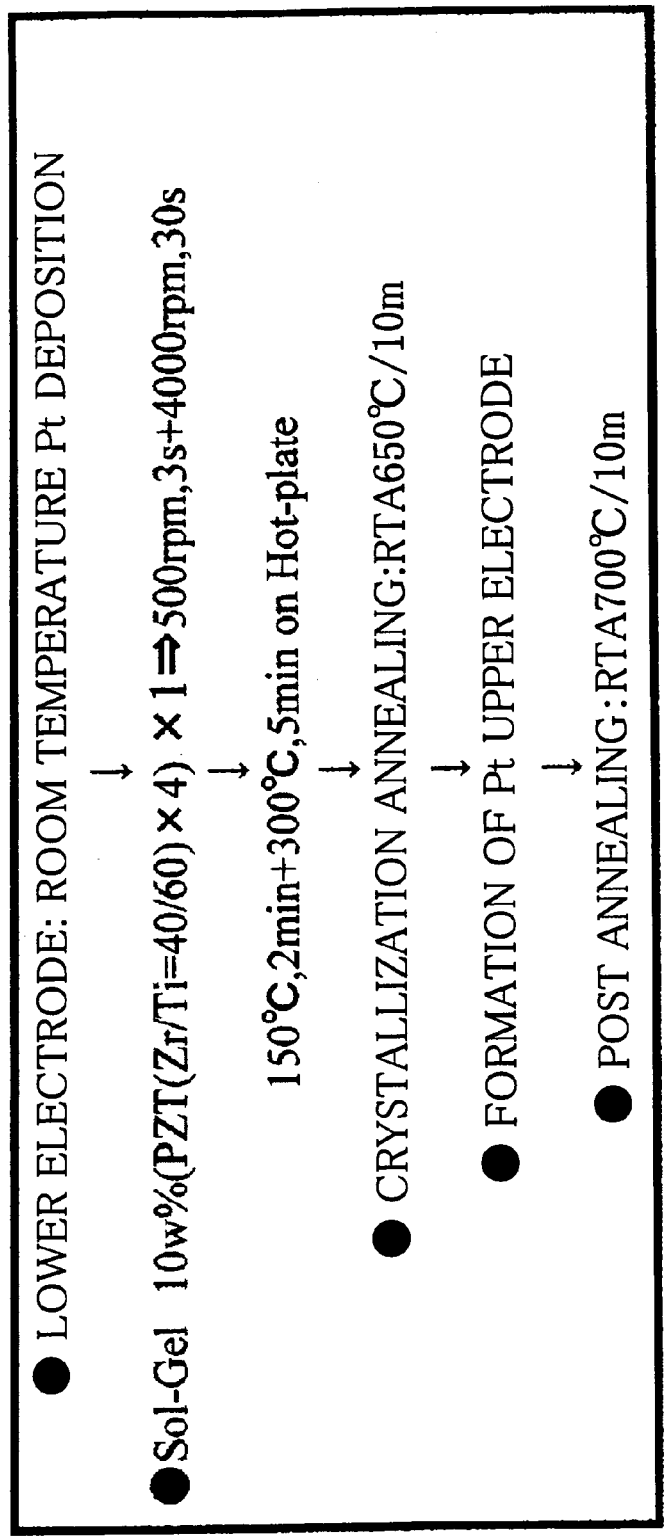
FIG. 8 illustrates formation of a PZTN thin film by spin coating method according to one embodiment of the present invention.
Figure 9:
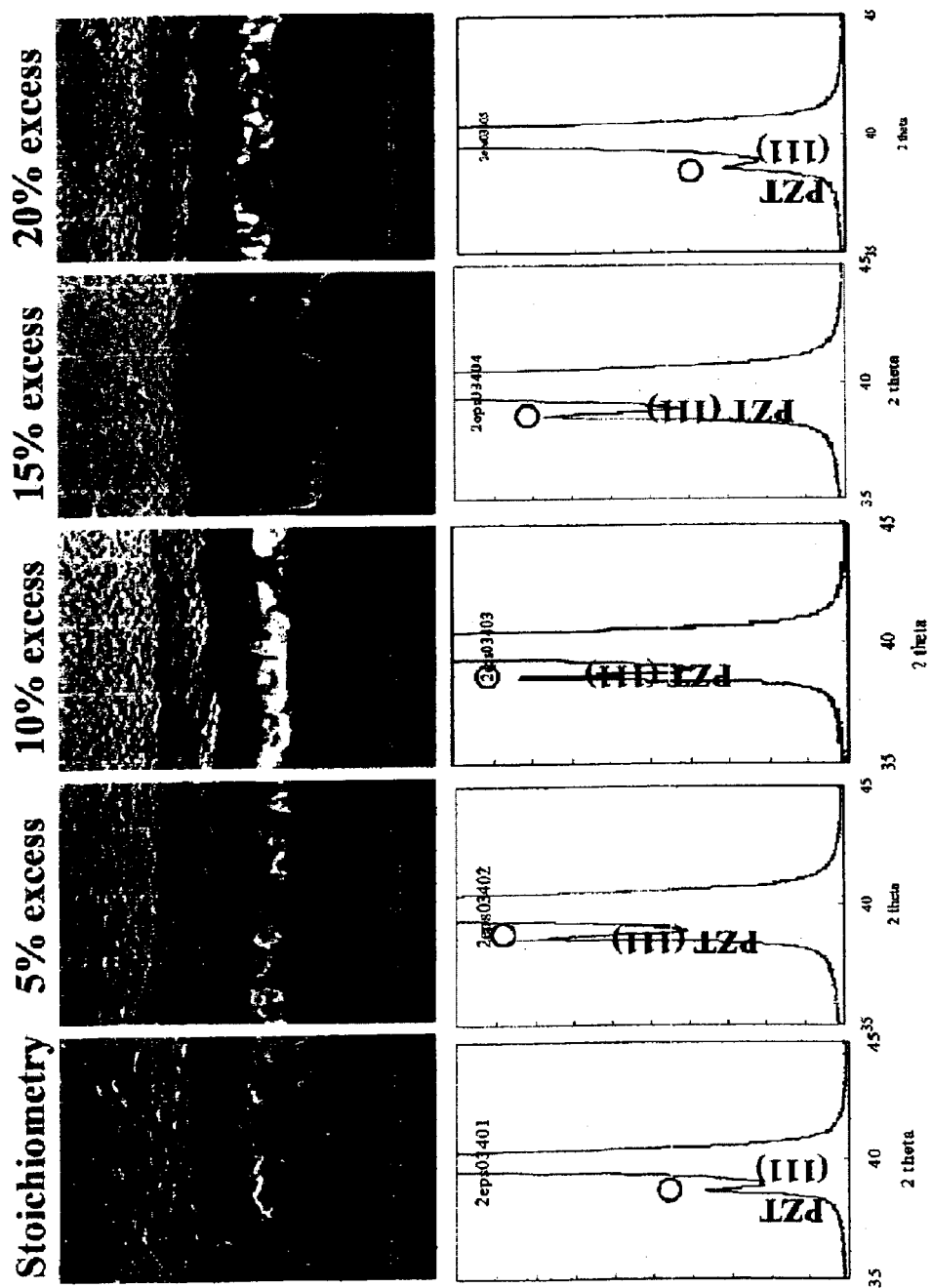
FIG. 9 shows surface morphology and crystallinity of a tetragonal PZT thin film when mixing $PbSiO_3$ into a sol-gel solution for forming PZT, according to one embodiment of the present invention.

A $PbZr_{0.4}Ti_{0.6}O_3$ thin film with a thickness of 200 nm was formed according to a flow shown in FIG. 8 by using 10 wt % sol-gel solutions for forming $PbZr_{0.4}Ti_{0.6}O_3$ (solvent: n-butanol) in which the amount of excess Pb was 0%, 5%, 10%, 15%, and 20%, and further adding 1 mol % of a 10 wt % sol-gel solution for forming $PbSiO_3$ (solvent: n-butanol). FIG. 9 shows XRD patterns and surface morphology of the resulting thin films.

About 20% excess Pb is necessary in a conventional method. However, it was found that crystallization sufficiently proceeds with the addition of 5% excess Pb. This suggests that excess Pb is almost unnecessary, since the $PbSiO_3$ catalyst added in an amount of only 1 mol % decreases the crystallization temperature of PZT. In the following description, 5% Pb excess solutions were used as solutions for forming PZT, $PbTiO_3$, and $PbZrTiO_3$.

Figure 10:
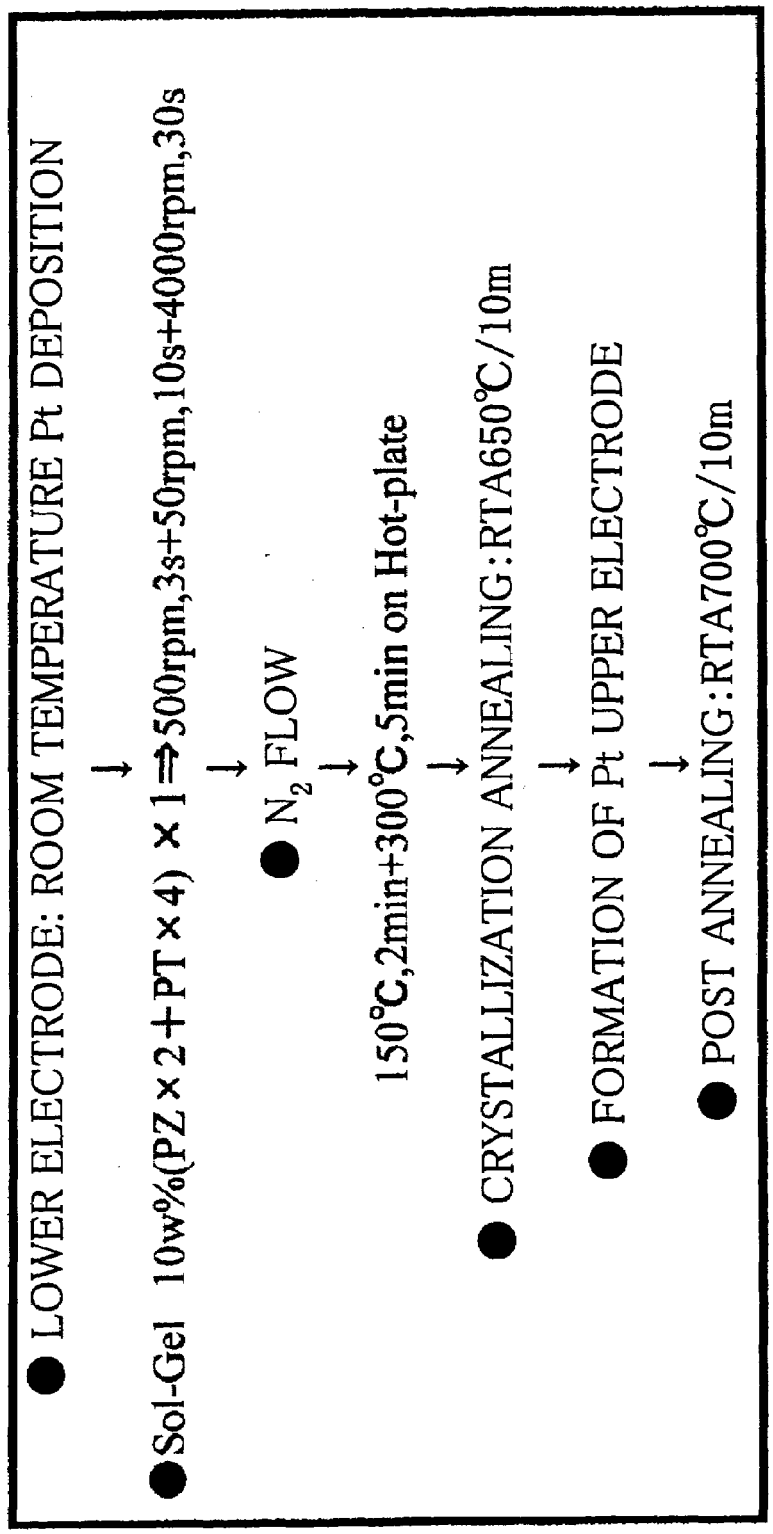
FIG. 10 illustrates formation of ferroelectric thin film by spin coating method according to one embodiment of the present invention.
Figure 11:
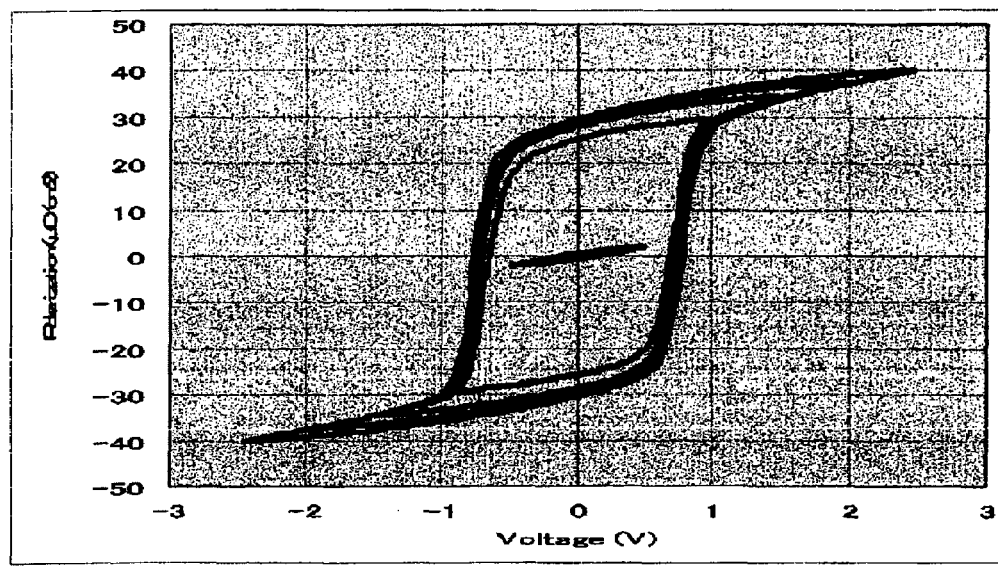
FIG. 11 is a graph showing hysteresis of a tetragonal PZT thin film according to one embodiment of the present invention.

A $PbZr_{0.4}Ti_{0.6}O_3$ ferroelectric thin film with a thickness of 200 nm was formed according to a flow shown in FIG. 10 by using a mixed solution in which 1 mol % of a 10 wt % sol-gel solution for forming $PbSiO_3$ (solvent: n-butanol) was added to a solution in which a 10 wt % sol-gel solution for forming $PbZrO_3$ (solvent: n-butanol) and a 10 wt % sol-gel solution for forming $PbTiO_3$ (solvent: n-butanol) were mixed at a ratio of 4:6. As shown in FIG. 11, the resulting hysteresis characteristics had excellent squareness. This suggests that $PbTiO_3$ was first crystallized on Pt from the 10 wt % sol-gel solution for forming $PbTiO_3$ (solvent: n-butanol) by using the solution in which the 10 wt % sol-gel solution for forming $PbZrO_3$ (solvent: n-butanol) and the 10 wt % sol-gel solution for forming $PbTiO_3$ (solvent: n-butanol) were mixed at a ratio of 4:6. The $PbTiO_3$ acts as the initial crystal nuclei and eliminates lattice mismatch between Pt and PZT, whereby PZT was easily crystallized. Moreover, $PbTiO_3$ and PZT were continuously formed while forming an excellent interface by using the mixed solution, whereby hysteresis with excellent squareness was obtained. In addition, since all the thin films are single (111)-orientated as shown in FIG. 9, hysteresis having excellent squareness and enabling low voltage drive was obtained.

Figure 12:
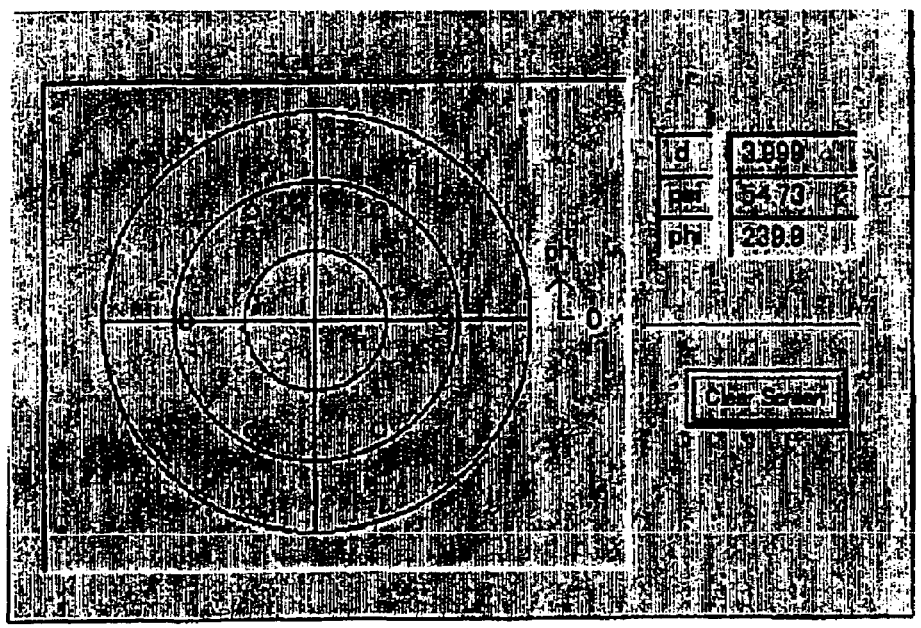
FIG. 12 is a diagram showing a (100) peak position in a (010) plane with respect to a (111) peak in the (010) plane of a (111)-oriented PZT single crystal, according to one embodiment of the present invention.
Figure 13:
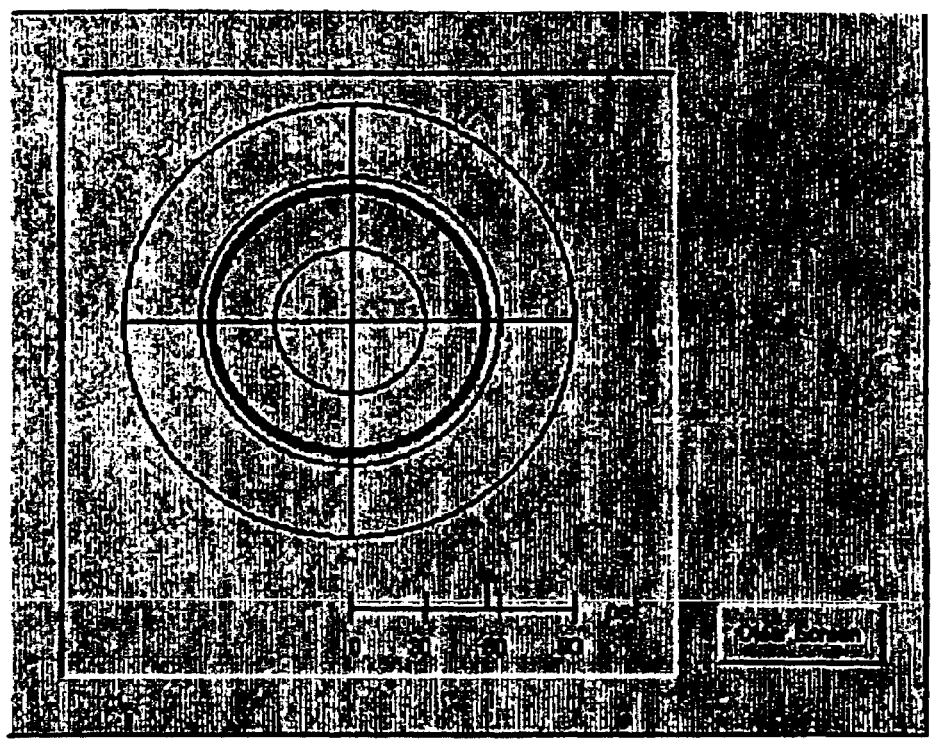
FIG. 13 is a diagram showing a (100) peak position in a (010) plane with respect to a (111) peak in the (010) plane of a (111)-oriented PZT polycrystalline thin film, according to one embodiment of the present invention.
Figure 14:
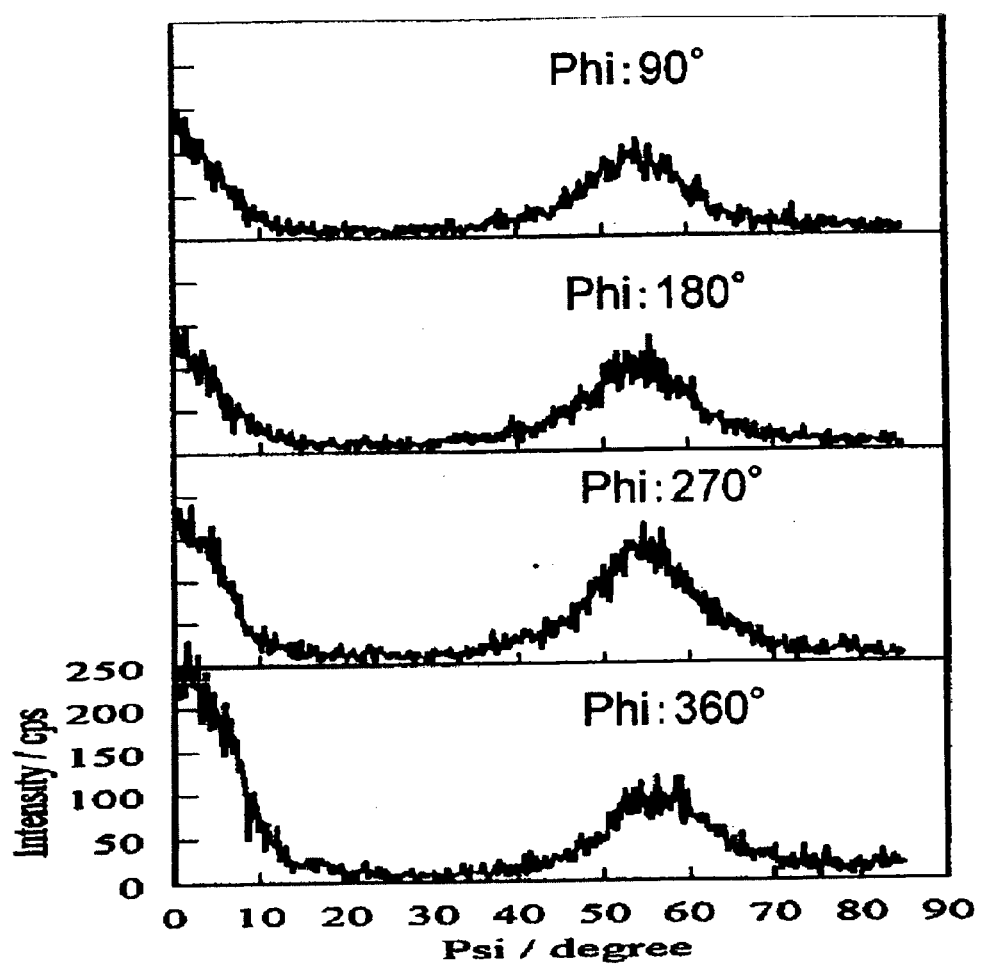
FIG. 14 is a graph showing (100) peak positions when a Phi angle is fixed at 0°, 90°, 180°, and 360° and a Psi angle is assigned from 0° to 90° in a (111)-oriented PZT polycrystalline thin film, according to one embodiment of the present invention.

A (100) peak position in the plane was investigated with respect to the (111) peak in the (010) plane of the resulting (111)-oriented PZT thin film. If the resulting PZT thin film is a single crystal, six points indicating (100) should appear as shown in FIG. 12. However, if the resulting PZT thin film is a polycrystal, the position of the (100) peak cannot be specified, and the shape should become circular as shown in FIG. 13. The Phi angle was fixed at 0°, 90°, 180°, and 360°, and the Psi angle was assigned from 0° to 90°. The results are shown in FIG. 14. All had a peak at 54.73°. Specifically, the PZT of the present invention is a polycrystal, and the polarization axes are arranged at random in the orientation plane.

What is claimed is:

1. A ferroelectric film which functions by application of an electric field, in which each of polarization axes of the ferroelectric film is at a constant angle to an applied electric field direction and is isotropically distributed in a ferroelectric film plane in which a direction of the electric field is normal, wherein the ferroelectric film uses a tetragonal Pb(Zr,Ti)O$_3$ ferroelectric which is (111)-oriented along the applied electric field direction with respect to a ferroelectric film plane.

2. The ferroelectric film as defined in claim 1, formed of a polycrystal highly oriented in the applied electric field direction in a ferroelectric film plane.

3. A ferroelectric memory device using the ferroelectric film as defined in claim 1.

4. A ferroelectric piezoelectric device using the ferroelectric film as defined in claim 1.

5. A ferroelectric film which functions by application of an electric field, in which each of polarization axes of the ferroelectric film is at a constant angle to an applied electric field direction and is isotropically distributed in a ferroelectric film plane in which a direction of the electric field is normal, wherein the ferroelectric film uses a rhombohedral Pb(Zr,Ti)O$_3$ ferroelectric which is (001)-oriented along the applied electric field direction with respect to a ferroelectric film plane.

6. The ferroelectric film as defined in claim 5, formed of a polycrystal highly oriented in the applied electric field direction in a ferroelectric film plane.

7. A ferroelectric memory device using the ferroelectric film as defined in claim 5.

8. A ferroelectric piezoelectric device using the ferroelectric film as defined in claim 5.

* * * * *